United States Patent
Gerowitz et al.

(10) Patent No.: US 7,865,786 B2
(45) Date of Patent: *Jan. 4, 2011

(54) SCANNED MEMORY TESTING OF MULTI-PORT MEMORY ARRAYS

(75) Inventors: Robert Glen Gerowitz, Raleigh, NC (US); Kenichi Tsuchiya, Cary, NC (US)

(73) Assignee: International Business Machines Corporation, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 12/349,652

(22) Filed: Jan. 7, 2009

(65) Prior Publication Data
US 2009/0116323 A1  May 7, 2009

Related U.S. Application Data

(63) Continuation of application No. 11/250,953, filed on Oct. 14, 2005, now Pat. No. 7,506,225.

(51) Int. Cl.
G11C 29/32 (2006.01)
G11C 29/46 (2006.01)

(52) U.S. Cl. .................. 714/718; 714/733
(58) Field of Classification Search .................. None
See application file for complete search history.

(56) References Cited

U.S. PATENT DOCUMENTS

| | | | |
|---|---|---|---|
| 5,138,619 A | 8/1992 | Fasang et al. | 714/718 |
| 5,535,164 A | 7/1996 | Adams et al. | 365/201 |
| 5,579,322 A | 11/1996 | Onodera | 714/730 |
| 5,610,926 A | 3/1997 | Marris | 714/726 |
| 5,742,557 A | 4/1998 | Gibbins et al. | 365/230.05 |
| 5,796,745 A | 8/1998 | Adams et al. | 714/718 |
| 5,805,486 A | 9/1998 | Sharangpani | 708/524 |
| 6,070,256 A | 5/2000 | Wu et al. | 714/718 |
| 6,205,138 B1 | 3/2001 | Nihal et al. | 370/388 |
| 6,288,969 B1 | 9/2001 | Gibbins et al. | 365/230.05 |
| 6,360,342 B1 | 3/2002 | Lee et al. | 714/718 |
| 6,480,980 B2 | 11/2002 | Koe | 714/738 |
| 6,510,530 B1 | 1/2003 | Wu et al. | 714/30 |
| 6,668,347 B1 | 12/2003 | Babella et al. | 714/733 |
| 6,671,842 B1 | 12/2003 | Phan et al. | 714/733 |
| 6,675,336 B1 | 1/2004 | Thakur et al. | 714/733 |
| 6,681,358 B1 | 1/2004 | Karimi et al. | 714/733 |
| 6,826,732 B2 | 11/2004 | Hunt et al. | 716/1 |
| 7,506,225 B2 * | 3/2009 | Gerowitz et al. | 714/718 |
| 2005/0165572 A1 | 7/2005 | Holt et al. | 102/117 |

FOREIGN PATENT DOCUMENTS

JP          10083698 A       3/1998

* cited by examiner

*Primary Examiner*—Jeffrey A Gaffin
*Assistant Examiner*—Dipakkumar Gandhi
(74) *Attorney, Agent, or Firm*—Winstead, P.C.

(57) ABSTRACT

A system for at-functional-clock-speed continuous scan array built-in self testing (ABIST) of multiport memory is disclosed. During ABIST testing, functional addressing latches from a first port are used as shadow latches for a second port's addressing latches. The arrangement reduces the amount of test-only hardware on a chip and reduces the need to write complex testing software. Higher level functions may be inserted between the shadow latches and the addressing latches to automatically provide functions such as inversions.

10 Claims, 6 Drawing Sheets

SCANNED MEMORY TESTING OF MULTI-PORT MEMORY ARRAYS

CROSS REFERENCE TO RELATED APPLICATIONS

The present application is a continuation application of pending U.S. patent application Ser. No. 11/250,953, which was filed on Oct. 14, 2005, which is assigned to the assignee of the present invention. The present application claims priority benefits to U.S. patent application Ser. No. 11/250,953.

TECHNICAL FIELD

The present invention relates generally to the field of ASIC design and manufacturability, and in particular, to built-in self test mechanisms for memory.

BACKGROUND INFORMATION

Many integrated circuits facilitate defect identification using Built-In Self Test (BIST) mechanisms. The term "BIST" can refer to testing techniques in which parts of a circuit (chip, board, or system) are used to test the circuit itself. BIST circuits may be formed directly on the same chip when forming the integrated circuits and other circuit components that require testing. Such BIST schemes may be used during wafer level manufacturing test to screen out defects. Alternatively, BIST schemes may be used after each power-on to conduct self-checking of the circuits. The term "ABIST," can mean "Array BIST," or a BIST system designed to test an embedded memory device. Testing multi-port memory (e.g., Processor internal Register Memory Array) may present complications, such as how to fully test port interactions without necessitating large amounts of extra test-only hardware. Multi-port memory may be tested using a micro-architecture specific program such as an Architectural Verification Program (AVP). An AVP may be any software or firmware program that is intended to execute in a chip to verify architected functions of the chip. In the case of multi-port memories, an AVP may be designed to fully verify a particular embedded memory. However, if the memory is later embedded in a different chip or has a slightly different implementation, the AVP program must be changed. In addition, the AVP is generally developed late in the design process, typically after the hardware is developed, and it is a complex process to test memory array cell characteristics. Since creating and maintaining such AVP programs can be labor-intensive and burdensome, it is difficult to accomplish this late in the design process without causing schedule or quality slippage.

Implementing an ABIST system may require using valuable chip area to incorporate ABIST hardware. Accordingly, to optimize an ABIST scheme, it may be desirable to reduce the amount of "test-only" hardware needed by an ABIST system. Test-only hardware may be considered any hardware unnecessary for normal functionality but necessary for ABIST testing. Such test-only hardware occupies valuable space on a chip and should be minimized. Optimizing an ABIST system may also require testing at speeds that simulate functional conditions and exercise the dynamic characteristics of memory circuits. Additionally, scanned ABIST testing of consecutive reads, consecutive read/write, or consecutive writes of a memory typically requires additional logic configured as a set of shadow latches for addressing.

In summary, an invention is needed that allows scanned memory ABIST testing of multi-ported memory arrays at functional speeds, while minimizing the amount of test-only hardware needed for ABIST testing and reducing the potential for schedule slippage.

SUMMARY OF THE INVENTION

The present invention addresses the above issues by providing mechanisms for scanned memory testing that use functional data latches from one port as shadow latches for another port during ABIST testing to achieve functional speed testing of multi-ported memories.

An embodiment of the present invention is a memory array including a first and second port. The memory array includes a first functional latch bank. During normal (non-test) operation of the memory array, the first functional latch bank holds a first memory array address. The memory array includes a second functional latch bank. During the normal operation of the memory array, the second functional latch bank holds a second memory array address. During a test operation, a first plurality of latches from the first functional latch bank are interleaved to act as a plurality of shadow latches for a second plurality of latches from the second functional latch bank. An embodiment of the present invention includes a controller and an additional test-only shadow latch coupled to the controller and to a first latch of the first bank of functional latches.

BRIEF DESCRIPTION OF THE DRAWINGS

For a more complete understanding of the present invention and its advantages, refer to the following description taken in conjunction with the accompanying drawings, in which.

DETAILED DESCRIPTION

Figure 1A:
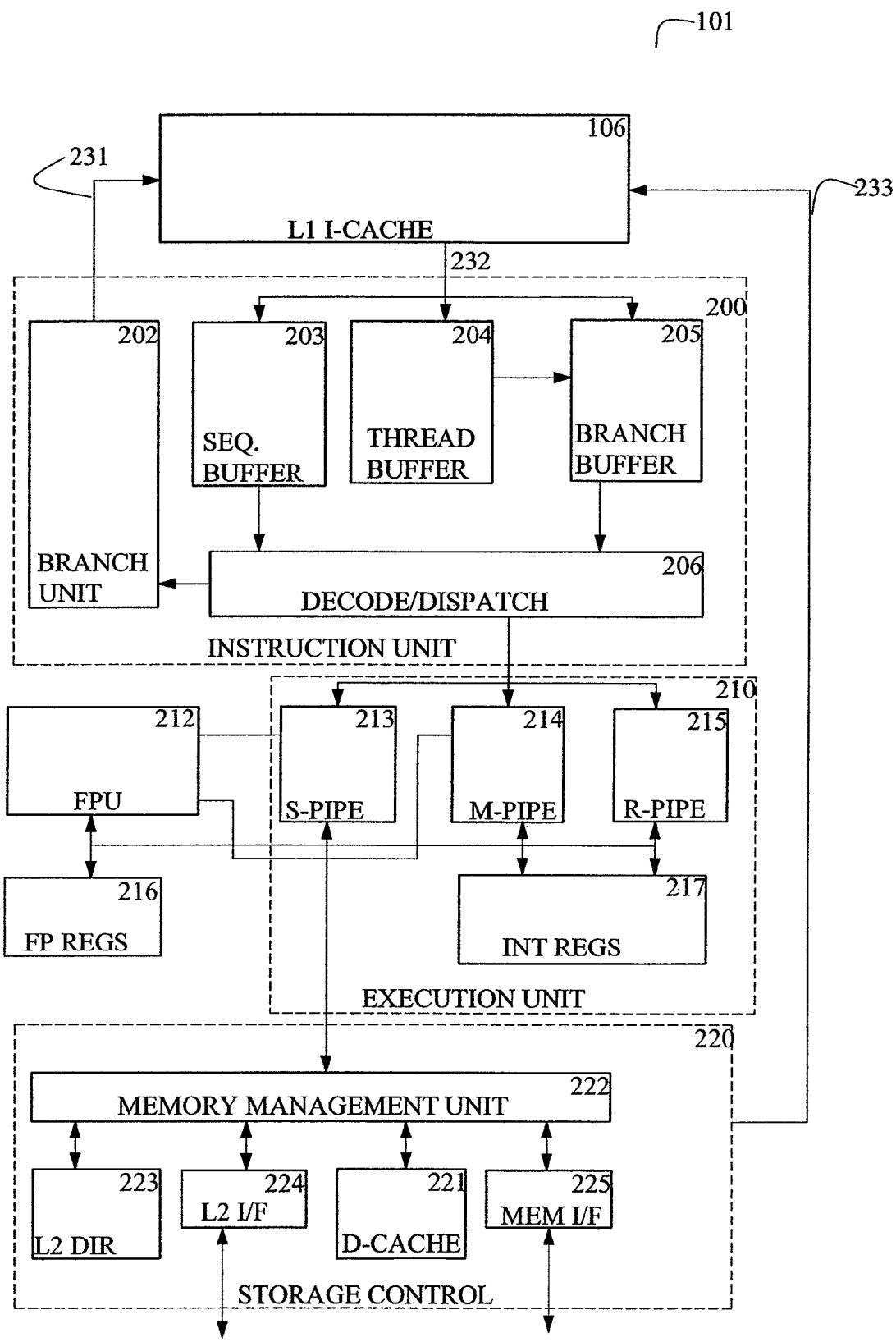
FIG. 1A illustrates a portion of a central processing unit (CPU) that incorporates scanned memory testing in accordance with an embodiment of the present invention.

In the following description, numerous specific details are set forth such as specific data bit lengths, address lengths, widths of data lines, and array sizes, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail. Some details concerning timing considerations, detection logic, specific ABIST software code and the like have been omitted inasmuch as such details are not necessary to obtain a complete understanding of the present invention and are within the skills of persons of ordinary skill in the relevant art. Refer now to the drawings wherein depicted elements are not necessarily shown to scale and like or similar elements may be designated by the same reference numeral through the several views.

FIG. 1A illustrates major components of CPU 101, which may be part of a data processing system containing multiple CPUs. The components shown of CPU 101 are packaged on a single semiconductor chip. CPU 101 may conduct multiple instruction issuing and hardware multithreading by concurrently executing multiple instructions and multiple threads. To support multiple instructions executions and hardware multithreading, processor internal memory arrays such as floating point register 216 may have multiple ports with multiple read ports and one write port for each instruction issue pipe per each thread. Accordingly, in an embodiment of the present invention, floating point register 216 is a multi-port memory array that is subject to ABIST scanned testing.

Regarding the other components in FIG. 1A, CPU 101 includes instruction unit portion 200, execution unit portions 210 and 212, and storage control portion 220. Instruction unit 200 obtains instructions from L1 I-cache 106, decodes instructions to determine operations to perform, and resolves branch conditions to control program flow. Execution unit 210 performs arithmetic and logical operations on data in registers, and loads or stores data. Storage control unit 220 accesses data in the L1 data cache 221 or interfaces with memory external to the CPU where instructions or data may be fetched or stored.

Instruction unit 200 comprises branch unit 202, buffers 203, 204, 205, and decode/dispatch unit 206. Instructions from L1 I-cache 106 are loaded into one of the three buffers from L1 I-cache instruction bus 232. Sequential buffer 203 may store 16 instructions in the current execution sequence. Branch buffer 205 may store 8 instructions from a branch destination. These are speculatively loaded into buffer 205 before branch evaluation, in the event the branch is taken. Thread switch buffer 204 stores 8 instructions for the inactive thread. In the event a thread switch is required from the currently active to the inactive thread, these instructions will be immediately available. Decode/dispatch unit 206 receives the current instruction to be executed from one of the buffers, and decodes the instruction to determine the operation(s) to be performed or branch conditions. Branch unit 202 controls the program flow by evaluating branch conditions and refills buffers from L1 I-cache 106 by sending an effective address of a desired instruction on L1 I-cache address bus 231.

Execution unit 210 comprises S-pipe 213, M-pipe 214, R-pipe 215, and a bank of general purpose registers 217. Registers 217 are divided into two sets, one for each thread. R-pipe 215 is a pipelined arithmetic unit for performing a subset of integer arithmetic and logic functions for simple integers. M-pipe 214 is a pipelined arithmetic unit for performing a more complex larger set of arithmetic and logic functions. S-pipe 213 is a pipelined unit for performing load and store operations. Floating point unit 212 and associated floating point registers 216 are used for certain complex floating point operations that typically require multiple cycles. Similar to general purpose registers 217, floating point registers 216 are divided into two sets, one for each thread.

Storage control unit 220 comprises memory management unit 222, L2 cache directory 223, L2 cache interface 224, L1 data cache (D-cache) 221, and memory bus interface 225. L1 D-cache 221 is an on-chip cache used for data (as opposed to instructions). L2 cache directory 223 is a directory of the contents of CPU 101's L2 cache (not shown). L2 cache interface 224 handles the transfer of data directly to and from L2 cache (not shown). Memory bus interface 225 handles the transfer of data across a memory bus (not shown), which may be to main memory (not shown) or to L2 cache units (not shown) associated with other CPUs (not shown). Memory management unit 222 is responsible for routing data accesses to the various units. For example, when S-pipe 213 processes a load command, requiring data to be loaded to a register, memory management unit may fetch the data from L1 D-cache 221, L2 cache (not shown), or main memory (not shown). Memory management unit 222 determines where to obtain the data and instructions. L1 D-cache 221 is directly accessible, as is the L2 cache directory 223, enabling memory management unit 222 to determine whether the data is in either L1 D-cache 221 or the L2 cache (not shown). If the data is in neither on-chip L1 D-cache nor the L2 cache (not shown), it is fetched from memory bus (not shown) using memory interface 225. Similarly, if the instruction is not in L1 I-cache 106, it is fetched from the L2 cache (not shown) or the main memory through path 233.

Although FIG. 1A illustrates an embodiment of the present invention implemented within a CPU, the present invention is not limited to such embodiments. The present invention can also be embodied in other devices having logic circuitry and memory embedded on the same semiconductor chip, such as in an I/O (input/output) adapter in a data processing system. Additionally, embodiments of the present invention may be implemented in conjunction with other multiport arrays, such as general purpose registers 217 (FIG. 1A).

Figure 1B:
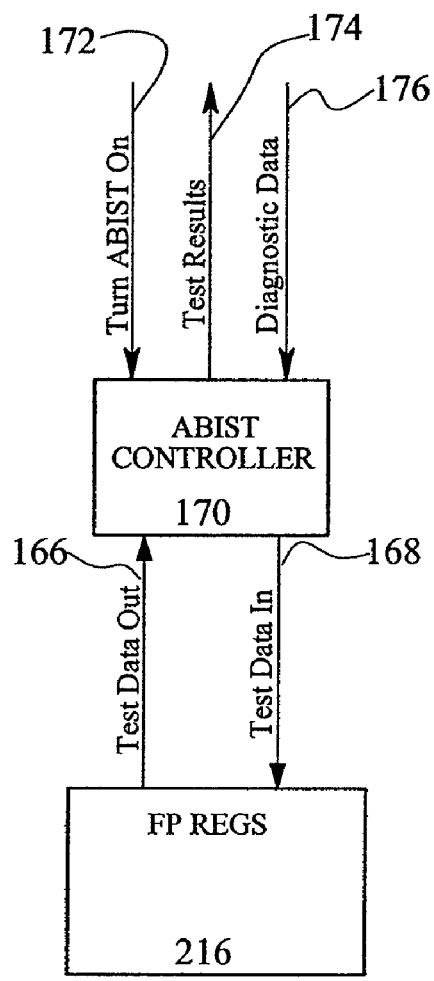
FIG. 1B illustrates an ABIST controller operatively coupled to a multiport memory array.

FIG. 1B illustrates the interconnection of an ABIST controller 170 with floating point registers 216, in accordance with an embodiment of the present invention. As shown, ABIST controller 170 is configured to test floating point registers 216 from FIG. 1A. ABIST controller 170 receives an ON signal 172 from an external source (not shown). In response, ABIST controller 170 turns ON and sends test data over test data line 168 to floating point registers 216. The controller 170 may receive the test data on line 176 from an external pattern generator or internal pattern generator (not shown) within 170 may be capable of generating common test patterns. The test data may be any of several common test patterns including a solid '1', solid '0', checkerboard, row stripe, or column stripe. ABIST controller 170 receives response data from floating point registers 216 over line 166. The test data out from line 166 can be processed by a data comparator (not shown) in the ABIST controller 170 to compare data received on line 166 with expected data values. The controller 170 may use information from the comparator in ABIST controller 170 to determine whether the floating point registers 216 pass or fail ABIST testing. Test results may be sent from the ABIST controller 170 to an external source (not shown) over test results line 174.

When testing memory such as floating point registers 216, it may be advantageous if ABIST controller 170 performs serial scanning of data rather than scanning the data in parallel, as in a typical ABIST scheme. Serially scanning the data using scanned ABIST testing may be advantageous because scanned ABIST testing generally requires fewer resources such as wiring, logic space, and the like. Accordingly, it may be easier to add new arrays to a system if ABIST testing is done serially rather than in parallel, because adding new arrays would require fewer additional wiring and other resources.

Figure 2A:
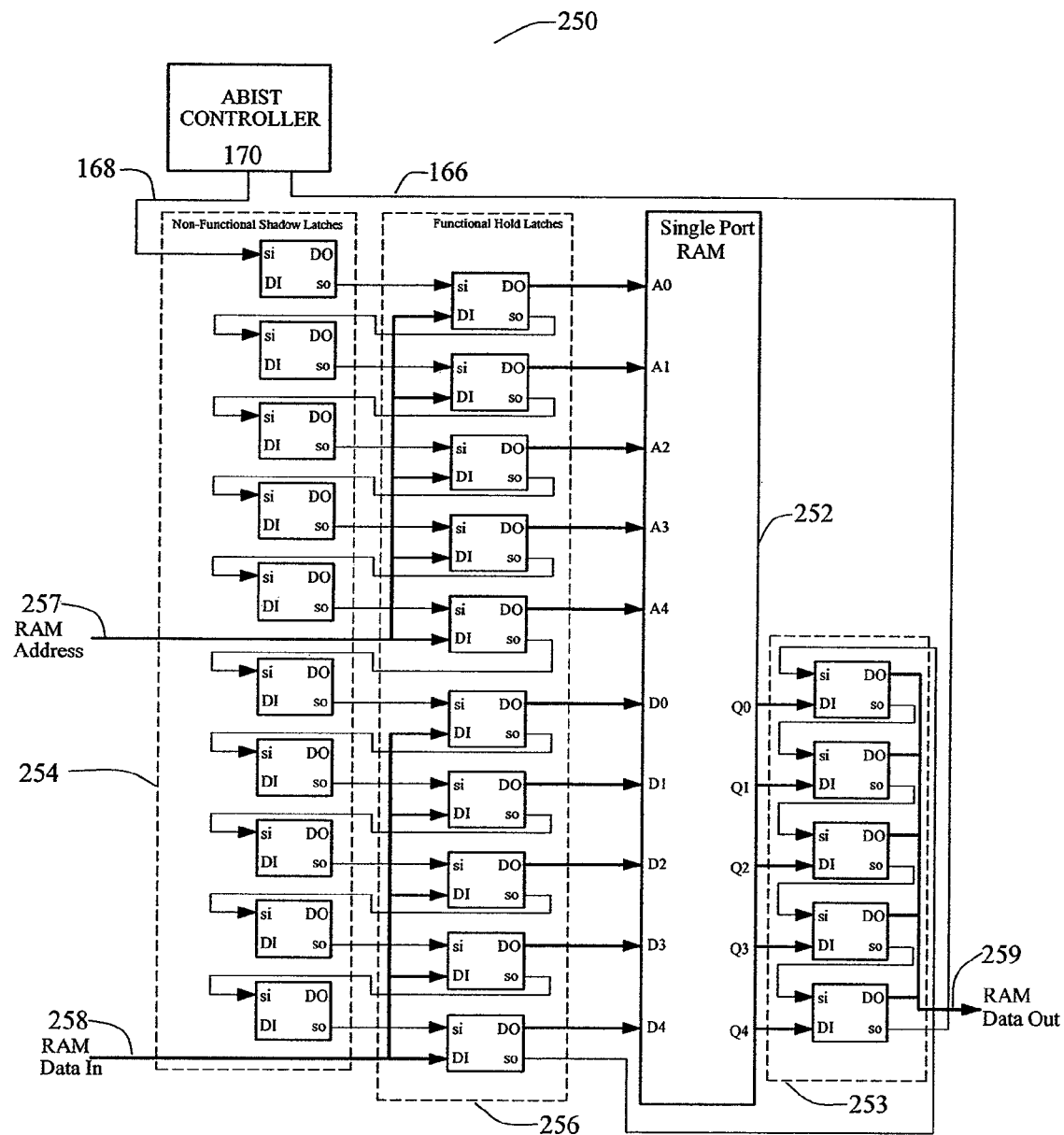
FIG. 2A illustrates a hardware environment for testing a single-port RAM using a shadow latch bank of test-only latches.

Referring now to FIG. 2A, circuitry 250 is illustrated. Circuitry 250 contains a single port RAM 252. Read and write addresses are shared and fed through RAM-address 257. FIG. 2A depicts using address/data latch bank 256 and shadow latch bank 254 for performing memory testing of RAM 252. RAM 252 could correspond to a single-ported version of floating point registers 216 (FIG. 1A), or any other single-port RAM. In operation, latch bank 256 stabilizes and holds functional addresses for sufficient time to meet timing requirements for the addresses presented to inputs of RAM 252. Test data and addresses may be sent from ABIST controller 170 over line 168 to functional hold latches in latch bank 256. Output data is sent back to ABIST controller through line 166.

As shown in FIG. 2A, RAM 252 is a single port RAM that may be tested using scanned ABIST controlled by ABIST controller 170. For functional mode, RAM-address 257 and RAM-data in 258 are fed to the latch bank 256 for writing into RAM 252. Alternatively, RAM-address 257 is fed to latch bank 256 for reading RAM 252. For functional reads, RAM output is captured by the output latch bank 253. For scanned ABIST, shadow latch bank 254 is required. Shadow latch bank 254 is made up of test-only shadow latches. Shadow latch bank 254 allows the test environment to test the device under more stressful conditions, such as performing a READ operation followed by another READ operation to two different addresses upon successive applications of a functional clock (not shown) running at functional clock speeds. As shown in FIG. 2A, circuitry 250 requires one additional shadow latch for each functional hold latch. The shadow latches in shadow latch bank 254 represent additional test-only overhead, because they are not used for functional purposes during operation.

Figure 2B:
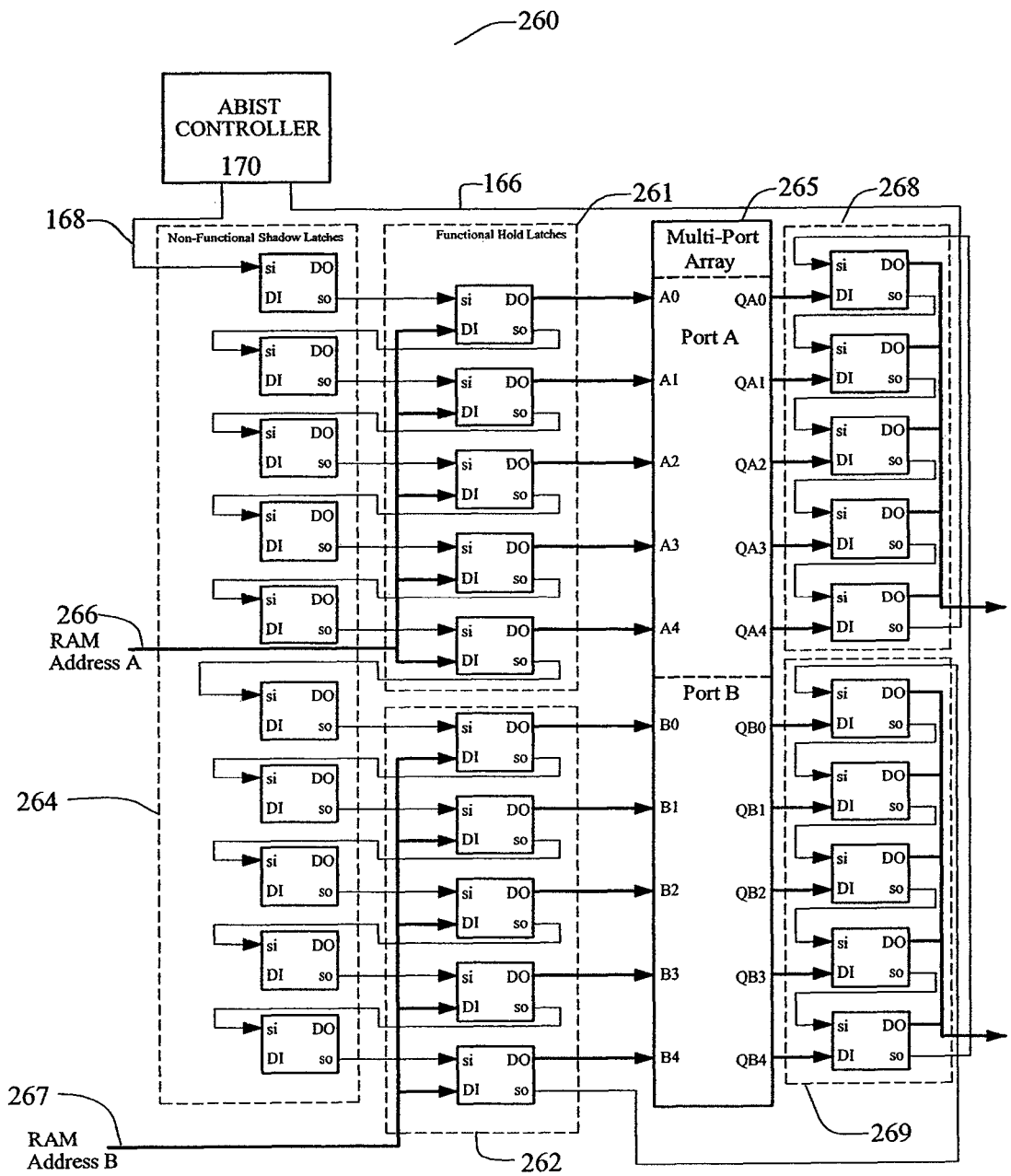
FIG. 2B illustrates a hardware environment for testing a multi-port RAM using a shadow latch bank of test-only latches.

FIG. 2B illustrates a hardware environment 260 for carrying out ABIST testing using test-only hardware latches in latch bank 264 as shadow latches to the functional latches in latch banks 261 and 262. RAM 265 depicts a multiport RAM containing port A and port B. For simplicity and clarity, components such as data ports are omitted from RAM 265 as shown, since such ports are typically understood by those of ordinary skill in the art.

For testing port A, ABIST controller 170 sends test address data over line 168 for shadow latch bank 264, hold latch bank 261, hold latch bank 262, port A, and port B. In functional mode, RAM-address A 266 and RAM-address B 267 are latched by latch banks 261 and 262, and the output latch bank 268 and output latch bank 269 capture RAM 265 outputs. In testing, the outputs of RAM 265 are sent to the ABIST controller 170 through scan data path 166 for testing and verifying. Latch bank 264 represents the type of overhead intended to be reduced by principles of the present invention.

Figure 3A:
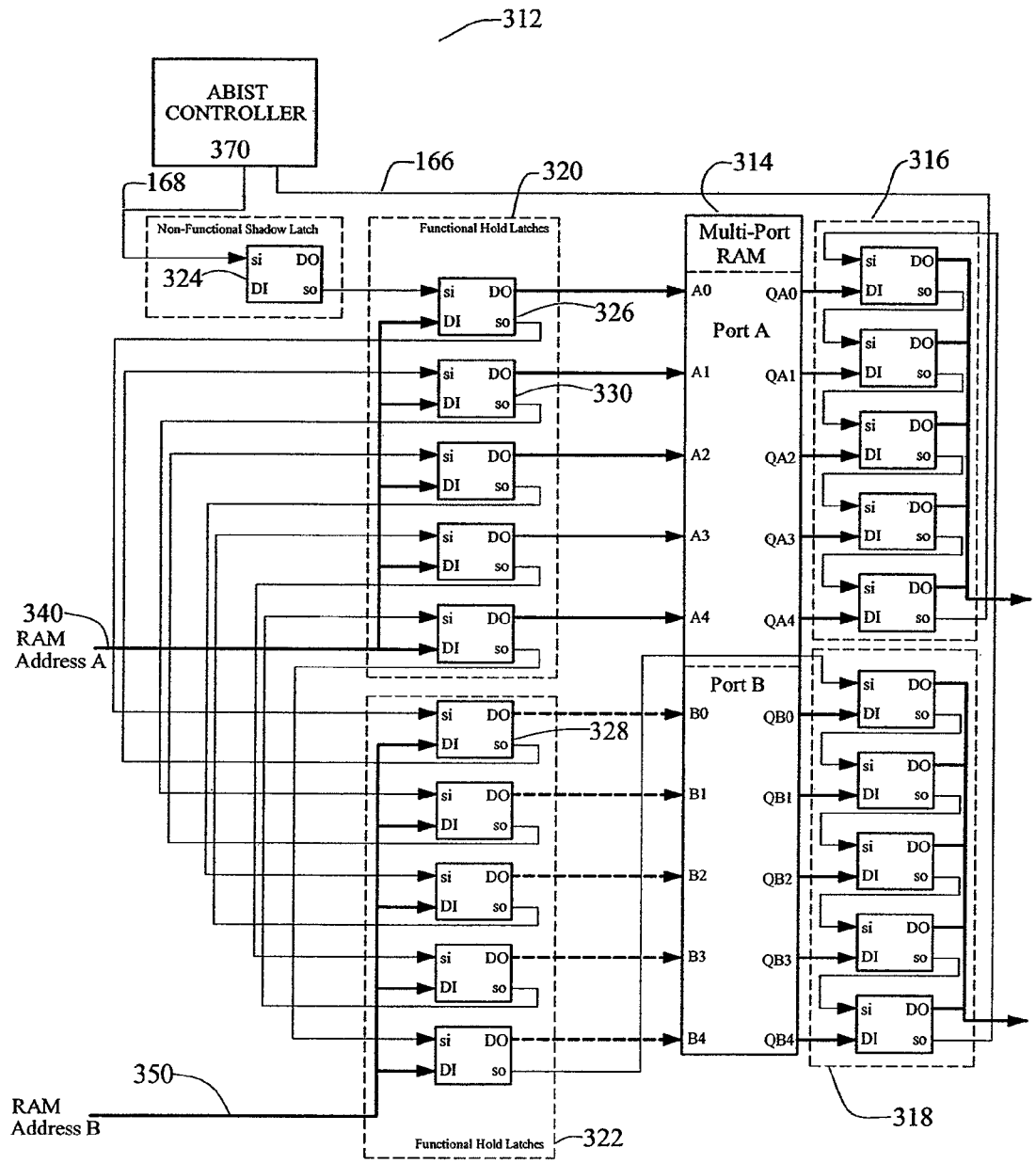
FIG. 3A illustrates a hardware environment for testing a multi-port RAM using functional latches from port B as shadow latches for port A.

FIG. 3A illustrates representative circuitry 312 for performing ABIST testing of multi-port memory 314 in accordance with an embodiment of the present invention. Memory 314 could correspond to floating point registers 216 from FIG. 1A. As shown, memory 314 comprises two ports; however, showing only two ports in memory 314 is not meant to limit the scope of the present invention, and principles of the invention can be extended to registers, RAM, or other memory with three or more ports. In reality, floating point (FP) registers may be implemented with six-reads/three-writes ports or more to accommodate multi-issues and multi-threads. In operation, functional latch bank 320 holds RAM-address A 340 for port A. Similarly, in operation, functional latch bank 322 holds RAM-address B 350 for port B. Accordingly, functional latch banks 322 and 320 hold addresses to meet the timing requirements of memory 314. However, during ABIST testing, latches in functional latch bank 322 are interleaved to act as shadow latches for latch bank 320. Using functional hold latches in latch bank 322 as shadow latches serves to limit the amount of test-only hardware needed for ABIST testing.

During ABIST testing of port A (FIG. 3A), ABIST controller 370 sends test data to functional latch bank 320. Latch 324 acts as a shadow latch for latch 326. Likewise, latch 328 acts as a shadow latch for latch 330. As shown in FIG. 3A, latch 324 is the only test-only latch needed for testing of port A. Therefore, using the ABIST scheme shown in FIG. 3A reduces the amount of test only hardware needed when compared to the ABIST scheme shown in FIG. 2B. Using port B's functional latch bank 322 during testing of port A reduces the need to have dedicated shadow latches such as those in shadow latch bank 264 (FIG. 2B). Instead of having a whole bank of shadow latches such as shadow latch bank 254 or 264 (FIGS. 2A and 2B), circuitry 312 utilizes shadow latch 324. During testing, shadow latch 324 may provide predecessor values to the functional hold latch 326 during read/write operations that occur on successive clock cycles. Such testing using back-to-back read and/or write cycles may stress a memory device and expose defects that otherwise would go undetected. Therefore, shadow latch 324 provides the ability to test RAM 314 on successive clock cycles, which is advantageous in detecting certain defects that may exist in RAM 314. In addition to shadow latch 324, embodiments of the present invention may utilize other latches (not shown). For example, a latch in the scan path between different types of memory ports, such as between the address and data ports or between the data and controls.

FIG. 3A illustrates a scheme for interleaving functional latch banks from one port to provide shadow latches for another port during testing. In an embodiment of the present invention, the principles shown in FIG. 3A can be extended to RAMs with more than two ports. For an odd number of ports, a similar ABIST scheme can interleave three ports as necessary. This type of approach supports a common scannable ABIST engine (such as ABIST controller 370) that runs at functional speeds. Running at functional speeds can be helpful in observing transition defects that might not be detected running at lower speeds. In addition, by not requiring dedicated shadow latches for ABIST testing, embodiments of the present invention require less logic, overhead, and labor to accomplish ABIST testing. This results in designs that use less chip area and power. Consequently, these designs may run faster and cooler than other scannable ABIST solutions.

Figure 3B:
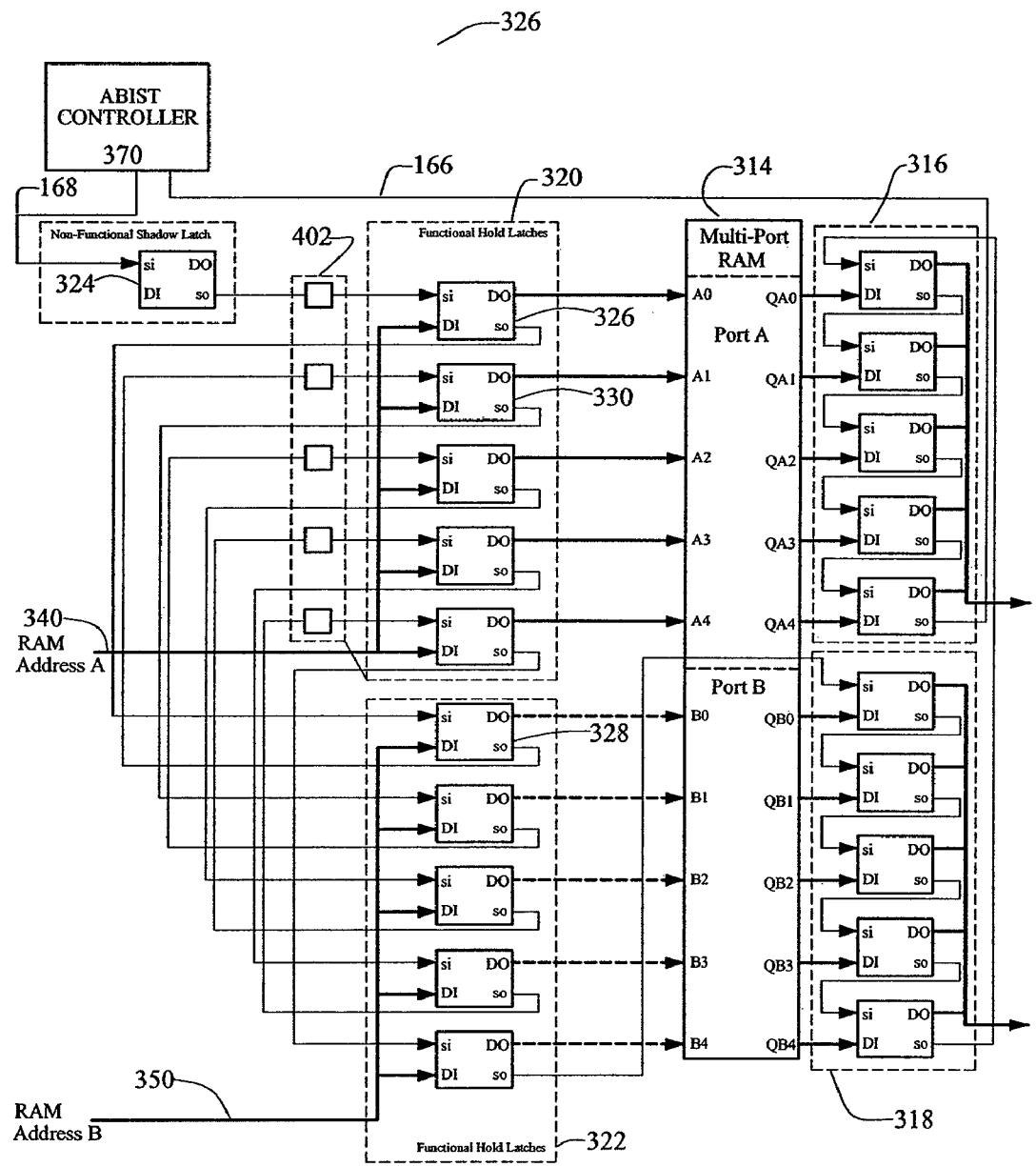
FIG. 3B illustrates a hardware environment for testing a multi-port RAM using functional latches from port B as shadow latches for port A with additional circuitry for modifying the signals between the shadow latches and functional latches.

FIG. 3B illustrates a hardware environment implementing principles of the present invention. Like-numbered elements in FIG. 3A and FIG. 3B correspond and descriptions for like-numbered items are not repeated. Compared to FIG. 3A, FIG. 3B adds circuit elements shown in circuit bank 402. During ABIST testing, circuit bank 402 functions to alter the signals between shadow latch bank 322 and functional latch bank 320. In an embodiment of the present invention, circuit bank 402 is comprised of an ABIST controllable function such as an inverting function; however, the components of circuit bank 402 may also be higher function logic such as linear feedback shift registers (LFSRs) that could automatically allow higher-level operations such as increasing or decreasing sequences of numbers to latch bank 320.

Although the present invention and its advantages have been described in detail, it should be understood that various changes, substitutions, and alterations could be made herein without departing from the spirit and scope of the invention as defined by the appended claims.

What is claimed is:

1. A memory array comprising:
  a first port;
  a second port;
  a first functional latch bank, wherein during a non-test operation of the memory array, the first functional latch bank holds a first memory array address; and
  a second functional latch bank, wherein during the non-test operation of the memory array, the second functional latch bank holds a second memory array address, wherein during a test operation, a first plurality of latches from the first functional latch bank are interleaved to act as shadow latches for a second plurality of latches from the second functional latch bank.

2. The memory array as recited in claim 1, the memory array further comprising:
   a controller; and
   a test-only shadow latch coupled to the controller and to one of the plurality of latches from the first functional latch bank.

3. The memory array as recited in claim 2, the memory array further comprising:
   a first input to the controller, wherein the input is operatively coupled to a first output of a fourth latch bank, wherein a third latch bank is operatively coupled to the first functional latch bank.

4. The memory array as recited in claim 3, the memory array further comprising:
   a second output to the third latch bank, wherein the second output is operatively coupled to a second input of the fourth latch bank.

5. The memory array as recited in claim 4, the memory array further comprising:
   a circuit bank operatively coupled to the first functional latch bank and the second functional latch bank for altering a plurality of signals during the test operation.

6. The memory array as recited in claim 5, wherein the circuit bank includes a plurality of inverters.

7. The memory array as recited in claim 5, wherein the circuit bank includes a plurality of linear feedback shift registers.

8. The memory array as recited in claim 2, wherein the memory array is a floating point register.

9. The memory array as recited in claim 2, wherein the memory array is random access memory (RAM).

10. The memory array as recited in claim 1, wherein the test operation occurs at a first clock speed substantially equal to a second clock speed of the non-test operation.

* * * * *